US009219444B2

(12) United States Patent
Borodulin et al.

(10) Patent No.: US 9,219,444 B2
(45) Date of Patent: Dec. 22, 2015

(54) BROADBAND HIGH EFFICIENCY AMPLIFIER SYSTEM AND A METHOD OF CONSTRUCTING HIGH POWER AMPLITUDE MODULATED RF SIGNAL

(75) Inventors: Dmitri Borodulin, South Lebanon, OH (US); George Cabrera, Mason, OH (US)

(73) Assignee: Imagine Communications Corp., Frisco, TX (US)

(*) Notice: Subject to any disclaimer, the term of this patent is extended or adjusted under 35 U.S.C. 154(b) by 659 days.

(21) Appl. No.: 13/565,119

(22) Filed: Aug. 2, 2012

(65) Prior Publication Data

US 2015/0303875 A1    Oct. 22, 2015

(51) Int. Cl.
*H03F 3/68* (2006.01)
*H03F 1/02* (2006.01)
*H03F 3/19* (2006.01)
(Continued)

(52) U.S. Cl.
CPC .............. *H03F 1/0205* (2013.01); *H03F 3/19* (2013.01); *H03F 3/211* (2013.01); *H03F 3/602* (2013.01); *H03F 2200/451* (2013.01); *H03F 2203/21106* (2013.01)

(58) Field of Classification Search
CPC ..... H03F 3/211; H03F 3/68; H03F 2200/534; H03F 2200/537; H03F 2200/541; H03F 1/0288; H03F 3/189; H03F 3/602; H03F 3/20; H03F 2200/204; H03F 2200/207; H04B 1/44; H04B 1/0475; H04B 1/30
USPC .......................... 330/53, 84, 124 R, 286, 295
See application file for complete search history.

(56) References Cited

U.S. PATENT DOCUMENTS 6,472,934 B1   10/2002   Pehlke
7,064,606 B2 *   6/2006   Louis ........................ 330/124 R
7,262,656 B2   8/2007   Shiikoma
(Continued)

FOREIGN PATENT DOCUMENTS

EP            2169823 A1     3/2010
WO    WO 2004/088837 A2   10/2002

OTHER PUBLICATIONS

Sarkeshi, et al. "A Novel Configuration for the Doherty Amplifier for Load Modulation Enhancement and Bandwidth Improvement", Research Paper—Singapore, Date Unknown, pp. 246-249.
(Continued)

*Primary Examiner* — Khanh V Nguyen
(74) *Attorney, Agent, or Firm* — Tarolli, Sundheim, Covell & Tummino LLP

(57) ABSTRACT

A broadband high efficiency (RF) radio frequency amplifier architecture is disclosed. Systems and methods are provided for generating an amplified radio frequency (RF) signal representing a baseband input signal. First, second, and third signal paths are configured to amplify first, second, and third intermediate signals to provide respective amplified signals. A signal combiner assembly is configured to combine the amplified signals to produce the compound amplified RF signal. The signals are combined such that a first amplified signal modulates a load impedance at respective outputs of an active device associated with the plurality of amplifiers in the second signal path, and one of the first amplified signal, the second amplified signal, and a sum of the first and second amplified signals modulates a load impedance of an active device associated with the plurality of amplifiers in the third signal path.

21 Claims, 5 Drawing Sheets

(51) Int. Cl.
*H03F 3/21* (2006.01)
*H03F 3/60* (2006.01)

(56) References Cited

U.S. PATENT DOCUMENTS

| | | |
|---|---|---|
| 7,508,885 B2 | 3/2009 | McGowan et al. |
| 8,718,580 B2 * | 5/2014 | Borodulin et al. ......... 455/127.1 |
| 8,948,306 B2 * | 2/2015 | Borodulin et al. ........ 330/124 R |
| 2001/0003433 A1 | 6/2001 | Hu et al. |
| 2003/0034835 A1 | 2/2003 | Poggi et al. |
| 2003/0034837 A1 | 2/2003 | Dittmer et al. |
| 2004/0189381 A1 | 9/2004 | Louis |
| 2010/0289571 A1 | 11/2010 | Hong et al. |

OTHER PUBLICATIONS

Burns, "Highly Efficient Amplifier Shows he Promise of Doherty Architecture", www.rfdesign.com Jun. 2007, 3 pages.
Mitzlaff, et al., "Novel Combiner Circuits for a Doherty RF Power Amplifier", www.ip.com—Prior Art Database, Jul. 22, 2002, 12 pgs.

* cited by examiner

BROADBAND HIGH EFFICIENCY AMPLIFIER SYSTEM AND A METHOD OF CONSTRUCTING HIGH POWER AMPLITUDE MODULATED RF SIGNAL

TECHNICAL FIELD

The present invention relates to radio frequency (RF) communication systems and is particularly directed to systems and methods for high power amplification of RF signals.

BACKGROUND OF THE INVENTION

An electronic amplifier is a device for increasing the power of a signal. Generally, an amplifier outputs energy from a provided power supply and controls the output to match an associated shape of an input signal with a larger amplitude. There are many types of electronic amplifiers, and they are commonly used in radio and television transmitters and receivers, high-fidelity stereo equipment, microcomputers and other electronic digital equipment, and audio amplifiers.

SUMMARY OF THE INVENTION

In accordance with an aspect of the present invention, a system is provided for generating a compound amplified radio frequency (RF) signal representing a baseband input signal. A first signal path is configured to amplify a first intermediate signal to provide a first amplified signal. A second signal path, which includes a plurality of amplifiers, is configured to amplify a second intermediate signal to provide a second amplified signal. A third signal path, which includes a plurality of amplifiers, is configured to amplify the third intermediate signal to provide a third amplified signal. A signal combiner assembly is configured to combine the first amplified signal, the second amplified signal, and the third amplified signal to produce the compound amplified RF signal. The signals are combined such that the first amplified signal modulates a load impedance at respective outputs of at least one of a plurality of active devices associated with the plurality of amplifiers in the second signal path and one of the first amplified signal, the second amplified signal, and a sum of the first amplified signal and the second amplified signal modulates a load impedance of at least one of a plurality of active devices associated with the plurality of amplifiers in the third signal path.

In accordance with another aspect of the present invention, a system is provided for generating an amplified radio frequency (RF) signal representing a baseband input signal. A first amplifier assembly, on a first signal path, is configured to amplify a first intermediate signal to provide a first amplified signal. A second amplifier assembly, on a second signal path, includes a plurality of amplifiers. The second amplifier assembly is configured to amplify a second intermediate signal to provide a second amplified signal. A third amplifier assembly, on a third signal path, includes a plurality of amplifiers. The third amplifier assembly is configured to amplify the third intermediate signal to provide a third amplified signal.

An RF modulator is configured to modulate an RF carrier signal with a baseband input signal to provide the first intermediate signal, the second intermediate signal, and the third intermediate signal. The RF modulator is configured such that one of the first amplified signal, the second amplified signal, and the combination of the first amplified signal and the second amplified signal is out-of-phase with the third amplified signal at the output of at least one of a plurality of active devices in the third amplifier assembly when an amplitude of the baseband input signal is in a first amplitude range. The RF modulator is further configured such that one of the first amplified signal, the second amplified signal, and the combination of the first amplified signal is in phase with the third amplified signal at the output of the at least one active device within the third amplifier assembly when the amplitude of the baseband input signal is in a second amplitude range.

In accordance with still another aspect of the present invention, a method is provided for generating an amplified radio frequency (RF) output signal from a baseband input signal. The baseband input signal is transformed to produce first, second, and third transformed baseband signals. A carrier signal is modulated with each of the first, second, and third transformed baseband signals to produce first, second, and third intermediate signals. The first, second, and third intermediate signals are amplified at respective first, second, and third amplifier assemblies to produce first, second, and third amplified signals. The first, second, and third amplified signals are combined to provide the amplified RF output signal.

The baseband input signal is transformed such that the first amplified signal has an amplitude that increases and decreases linearly and periodically between maximum and minimum values of the baseband input dynamic range and the second amplified signal has an amplitude that is zero when the baseband input signal is below a first break point representing a baseband input signal amplitude one-ninth of the amplitude dynamic range of the baseband input signal and reaches a maximum value at a second break point, representing a baseband input signal amplitude two-ninths of the amplitude dynamic range of the baseband input signal. The third amplified signal has an amplitude that is zero when the baseband input signal is below a third break point representing a baseband input signal amplitude one-third of the amplitude dynamic range of the baseband input signal.

BRIEF DESCRIPTION OF THE DRAWINGS

The foregoing and other features of the present invention will become apparent to those skilled in the art to which the present invention relates upon consideration of the following description of the invention with reference to the accompanying drawings, wherein.

DESCRIPTION OF THE PREFERRED EMBODIMENT

Figure 1:
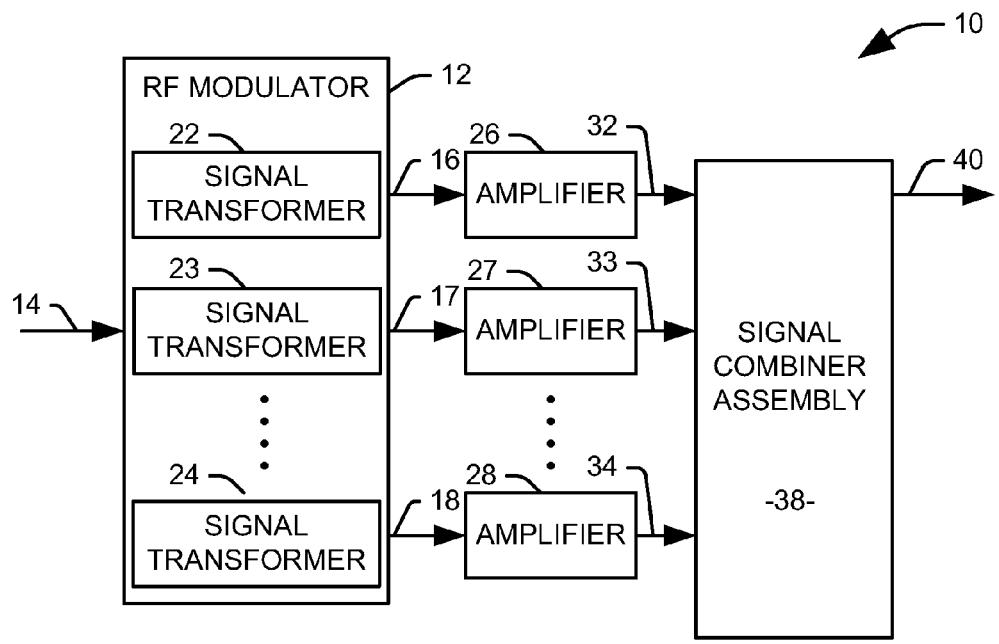
FIG. 1 is a functional block diagram of an amplifier system in accordance with an aspect of the present invention.

In accordance with another aspect of the present invention, systems and methods are provided for generating a radio frequency (RF) signal, with amplitude modulation representing a baseband input signal. A plurality of signal channels, referred to herein as "signal paths," are each configured to selectively generate and amplify an intermediate RF signal derived from the baseband input signal to provide an amplified RF signal. Specifically, an RF modulator is configured to amplitude modulate an RF carrier signal on each path with baseband signals that are derived from the input baseband signal. The modulation process can include a single stage or several stages. All frequency conversion channels are essentially identical and utilize LO signals derived from the same local oscillator (LO) to lock their mutual phase relationships.

In an implementation with three signal paths, a first signal is amplitude modulated with a first baseband waveform, a second signal is amplitude modulated with a second baseband waveform, and a third signal is amplitude modulated with a third baseband waveform. The first signal path includes adjustable RF phase shifter that has an ability to continuously adjust the phase of the first RF signal. The purpose of the phase adjustment is to establish a certain phase difference between signal paths. The details of phase relationships between three signals are described below. Each signal path also comprises a RF signal scaler. The scaler allows continuous amplitude adjustment of signal amplitude.

In the three signal path implementation, an amplitude dynamic range of the input baseband signal can be divided into nine equally sized amplitude intervals. There are eight break points separating the intervals. There are three transform functions, one per each amplified signal path, executed by the signal transformers inside of each signal path. The transform functions form amplitude and phase response of corresponding signals as a function of amplitude of input baseband signal. Transform functions can have a response of a piece-wise function that contains nine linear segments, each segment associated with corresponding input amplitude interval.

The transformed response of the first amplified signal has an amplitude that increases and decreases linearly over dynamic range of the input signal changing direction periodically. The second amplified signal has an amplitude that is zero when the input baseband input signal is below the first amplitude break point. The amplitude increases linearly with the baseband input signal when the baseband input signal is between the first break point and a third break point, then the function changes direction and at the break point three it descends linearly until fifth break point, after which it remains at zero between fifth break point and seventh break point, then it decreases linearly from seventh break point to the ninth break point, becoming negative until reaching peak level of the input signal. The transform response of the third channel provides zero level of amplitude of the signal during the initial three amplitude regions and a linear increase in level starting with break point three through the max input signal level. The shape of each transform function is selected to achieve a desired interaction between all three transformed signals with the purpose of constructing a modulation envelope of output RF signal into the shape of the input baseband signal.

All three signals propagate through corresponding amplifier channels. Their amplitude is scaled by the RF level scalers inside modulator to achieve voltage saturation at the corresponding output amplifier stages at certain amplitude breakpoints. Their phase is set by RF phase shifters to provide right phase relationships between amplified RF signals during interaction at the output combining network.

FIG. 1 is a functional block diagram of an amplifier system 10 in accordance with an aspect of the present invention. The system 10 includes an RF (radio frequency) modulator 12 configured to receive a baseband input signal 14 and produce a plurality of intermediate AM modulated RF signals 16-18 characterizing the input baseband signal. By "characterizing the input baseband signal" it is meant that the amplitude modulation of the intermediate RF signals 16-18 are derived from the input baseband signal as a transform function of input signal.

In accordance with an aspect of the present invention, the RF modulator 12 includes a plurality of signal transformers 22-24 configured to provide one of a phase and amplitude transform to the baseband input signal to provide respective transformed baseband signals for respective modulation channels (not shown). These transformed baseband signals can be upconverted to a destination carrier frequency by any appropriate means that allows the assignment of baseband signal content in form of amplitude and phase modulation, to provide the plurality of intermediate RF signals 16-18. The upconversion may include any process appropriate in the art for RF signal formation, such as I/Q modulation, spectrum shaping filters, direct digital synthesis, mirror image frequency cancellation, phase locked loop, signal level management or a similar process.

Each intermediate RF signal 16-18 is provided to an associated one of a plurality of amplifier assemblies 26-28. It will be appreciated that a given amplifier assembly 26-28 can include multiple amplifier stages connected in series, and that each stage can have amplifiers connected in parallel via appropriate signal splitters and combiners (not shown). The amplifiers associated with the corresponding signal path can each include an active RF power generating device, such as a bipolar junction transistor (BJT), a metal-oxide semiconductor field effect transistor (MOSFET), or an electronic tube. The amplifier assemblies 26-28 provide a plurality of RF output signals 32-34, each representing an amplified version of the intermediate RF signal 16-18.

The RF output signals 32-34 provided by the amplifier assemblies 26-28 are delivered to a signal combiner assembly 38. For example, the signal combiner assembly 38 can include a series of hybrid combiners, with the output of a first amplifier assembly 26 connected to an isolation port of a first hybrid combiner, and two outputs of a second amplifier assembly 27 connected to corresponding through and coupled ports of the first hybrid combiner. The output of the first hybrid combiner can be connected to the isolation port of a second hybrid combiner, with two outputs from a third amplifier assembly 28 connected to corresponding through and coupled ports of the second hybrid combiner. After being combined by the signal combiner assembly 38 into a single output 40 the output signal has the amplitude modulation that is essentially a replica of the baseband input signal.

In accordance with an aspect of the present invention, the RF modulator 12 can be configured to transform at least one of the phase and amplitude of the transformed RF signals 16-18 to improve DC-to-RF efficiency of the system and increase the efficient dynamic range (EDR) of the system. In one example, illustrated in detail in FIGS. 2 and 3, when the level of baseband input signal is low, the only active amplifier in the system 10 is the amplifier assembly 26 in the first signal path. The output stage of this amplifier is designed to handle peak signal levels not higher than one-ninth of the output dynamic range. Those are maximum amplitude values provided by first transform function. The output stage of the first amplifier assembly is driven into saturation when its output signal voltage is only one-ninth of a total output peak voltage of the system 10. Following the transform function response the first amplifier output stage reaches voltage saturation five times over entire input dynamic range. This means that its DC-RF efficiency reaches a maximum level five times over input dynamic range.

The second amplifier assembly 27 is designed to deliver up to two-ninths of the total peak voltage level while operating with a nominal load impedance $Z_0$. There are two identical output stage amplifiers that belong to the second signal path. The outputs of these amplifiers are combined by the first hybrid combiner 86 to form an output for the second signal path. Each amplifier is sized and matched to deliver $\sqrt{2}/9$ of total peak voltage level. At that output level the output stage is driven into voltage saturation mode and exhibits highest DC-RF efficiency. The transform function provides a response that drives output stage amplifiers of second path into voltage saturation mode twice over total input dynamic range.

Figure 2:
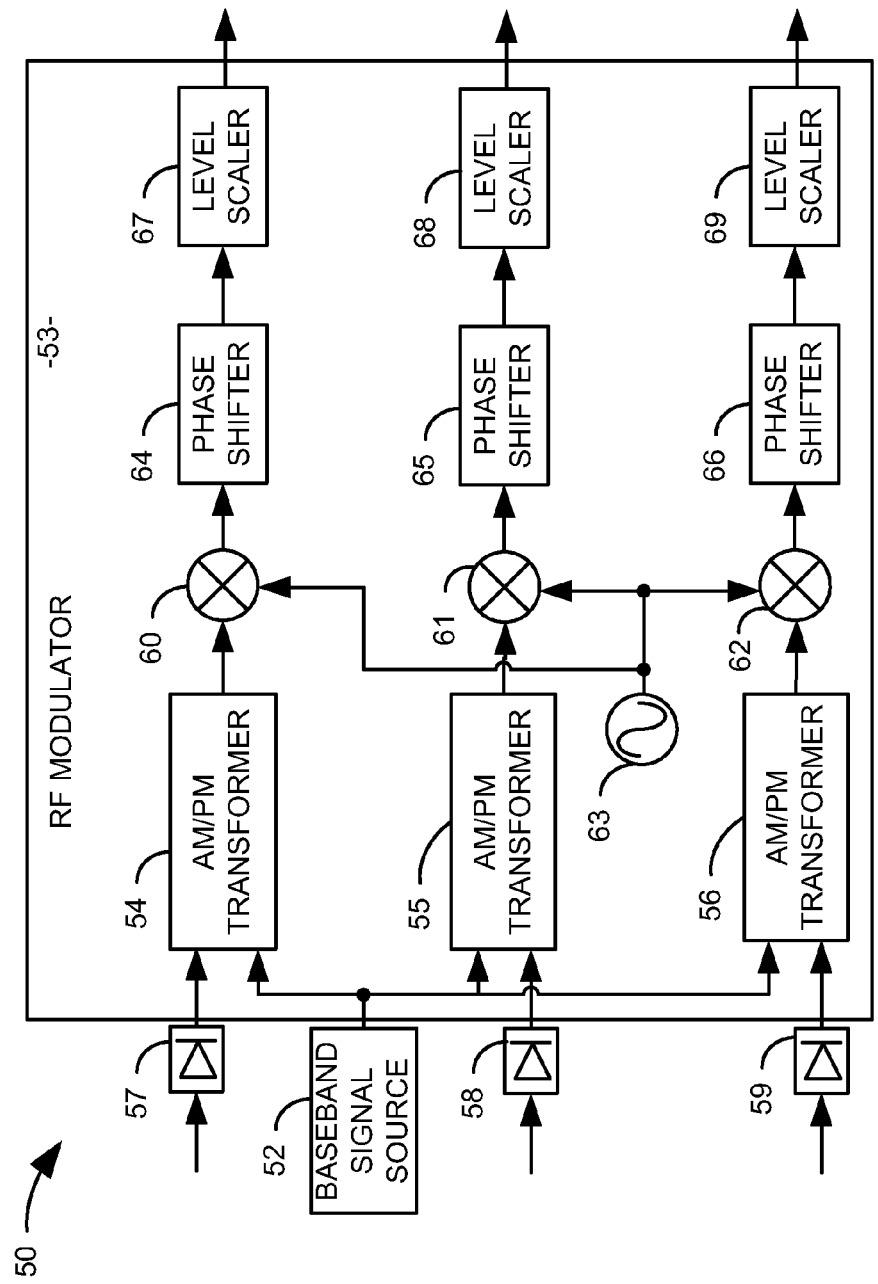
FIG. 2 illustrates a front-end of an example implementation of a system in accordance with an aspect of the present invention.
Figure 3:
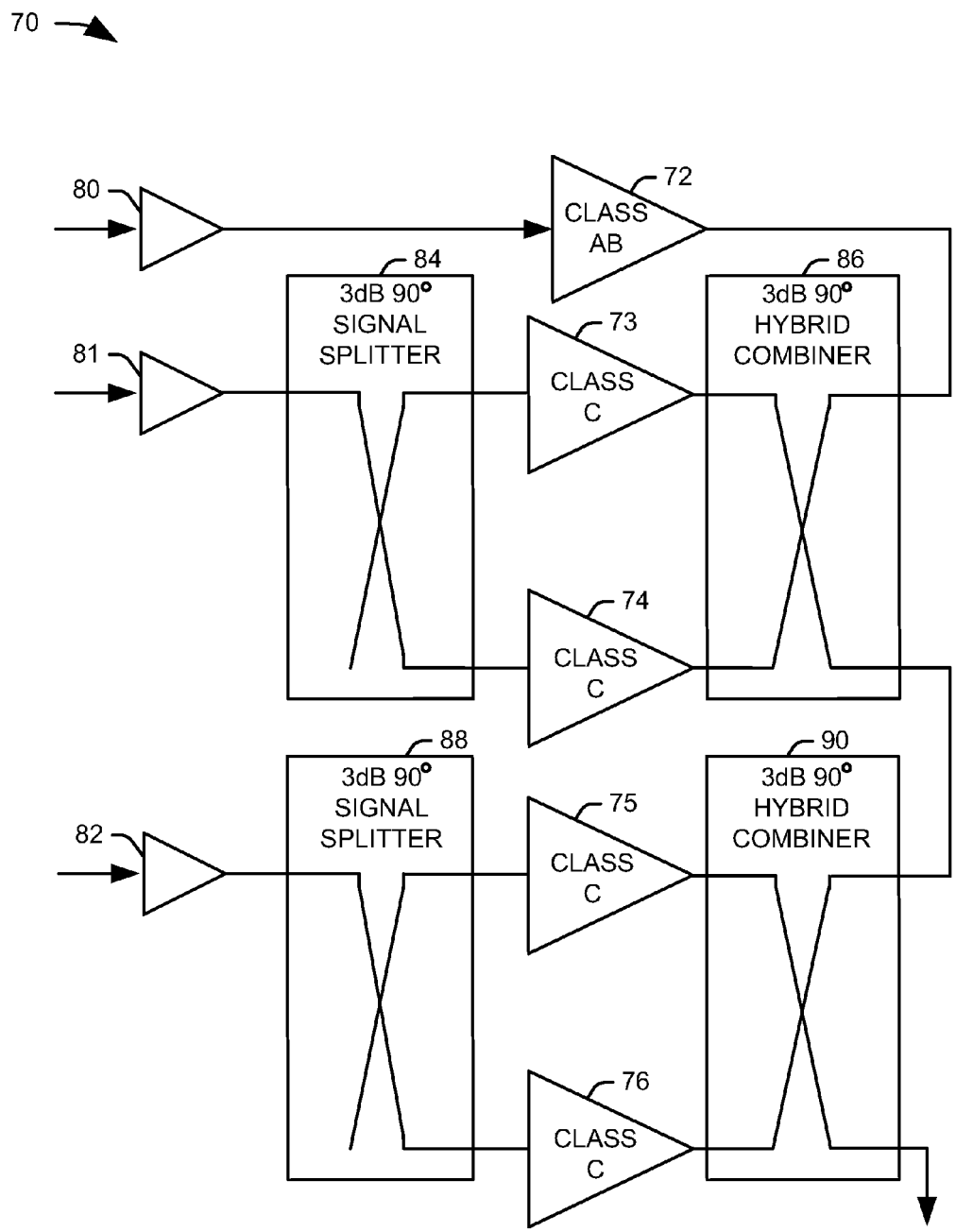
FIG. 3 illustrates a back-end, including the amplifier stages and signal combiner, of an example implementation of a system in accordance with an aspect of the present invention.

In the example illustrated in FIGS. 2 and 3, a third signal path includes a third signal transformer (e.g., 24) and a third amplifier assembly (e.g., 28). The third signal transformer performs a third transform function over the input baseband signal before the resulting signal is used to modulate RF carrier and amplified. The third amplifier assembly's output stages are sized and matched to deliver a combined signal with output voltage of six-ninths of the total peak voltage at nominal $Z_0$ load impedance. The third amplifier assembly comprises two output stage amplifiers, with each output amplifier stage delivering an output voltage level up to square root of two times three-ninths of the total peak level operating with nominal load impedance of $Z_0$. At this output voltage the output stage amplifiers are driven into a voltage saturation mode by setting the gain of a corresponding RF signal level scaler.

Once multiple signal paths are active, the RF modulator 12 can adjust the phase of the intermediate RF signals 16-18 such that the amplified signal or signals provided by one or more amplifiers (e.g., 26 and 27) modulate the load impedance at the outputs of active devices within a following amplifier's output stage. This combining arrangement can change the load impedance of the amplifiers as a function of input signal level. By manipulating the load impedance, the output stage of amplifiers associated with the later signal paths e.g., 27-28 can be operated in voltage saturation mode over an extended range of input signal levels, improving the DC-RF efficiency of the system.

FIGS. 2 and 3 provide a functional block diagram of one implementation of the system of FIG. 1 in accordance with an aspect of the present invention. In the illustrated implementation, three signal paths are used to provide a simplified example, although it will be appreciated that systems and methods in accordance with an aspect of the present invention can be expanded to more than three signal paths.

FIG. 2 illustrates a front-end 50 of an example implementation of a system in accordance with an aspect of the present invention. A baseband signal source 52 provides a baseband input signal to a radio frequency (RF) modulator 53 configured to transform the baseband input signal to provide transformed baseband signals associated with each of the signal paths and modulate a RF carrier signal with each transformed signal to provide intermediate signals for amplification. To this end, the RF modulator 53 can include respective signal transformers 54-56 configured to provide one or both of amplitude and phase transformation to the baseband output signal such that the amplified representations of the transformed signals (i.e., the outputs of the three amplifiers) interact to produce an output RF signal with a modulation envelope that is a replica of the baseband input signal.

The signal transformers 54-56 can also provide amplitude and phase predistortion to the baseband input signal to correct for AM-AM and AM-PM distortions introduced by the amplifiers comprising their associated signal paths and other components in the signal path. This predistortion can be adaptive, with an output signal of the first signal path sampled and provided to the first signal distorter 54 through a first downconverter 57, a combined output signal of the first signal path and the second signal path sampled and provided to the second signal distorter 55 through a second downconverter 58, and one of the system output sampled and provided to the third signal distorter 56 through a third downconverter 59.

The outputs of the signal transformers 54-56 can be provided to respective modulators 60-62 configured to apply one or both of amplitude and phase modulation to a carrier signal, provided by a local oscillator 63 to represent a desired signal content, represented by the baseband signal. Phase shifters 64-66 associated with each modulator 60-62 can be used to account for different phase shift values required at different RF carrier frequencies such that desired phase relations among the signal provided by the various signal paths can be achieved at the corresponding output port of active devices inside of output amplifier stages of the various signal paths. Specifically, a signal from one amplifier can be delivered in-phase with the signal amplified by a second amplifier assembly at the output port of each active device inside of an output stage of the second amplifier assembly to effectively increase the load impedance at the port. Conversely, the same signals can be delivered out-of-phase to the same ports to decrease the load impedance at the port, allowing for the first amplifier to decrease the load impedance and, therefore, modulate power level delivered by the output stage of the second amplifier assembly while operating in voltage saturation mode. Level scalers 67-69 associated with each modulator 60-62 control the level of the amplified signal, such that the intermediate signal provided to each amplifier assembly is scaled to drive its constituent amplifiers into saturation for an appropriate range of the baseband input signal.

FIG. 3 illustrates a back-end 70, including the amplifiers and signal combiner, as an example implementation of a system in accordance with an aspect of the present invention. In the illustrated implementation, five power amplifiers 72-76 are employed in the system, including an amplifier 72 associated with a first signal path, two amplifiers 73 and 74 associated with a second signal path and two amplifiers 75-76 associated with a third signal path. It will be appreciated that the amplifiers 72-76 can include any appropriate assemblies for high power amplification of RF signals. For example, each amplifier 72-76 can contain one or more active devices operating in parallel, a direct current (DC) power supply for the active devices, and appropriate impedance matching circuitry at the input and output of the device. The active devices can be implemented to include, for example, metal-oxide semiconductor field effect transistors (MOSFETs), bipolar junction transistors (BJTs), junction gate field effect transistors (JFETs), or vacuum tubes.

Figure 4:
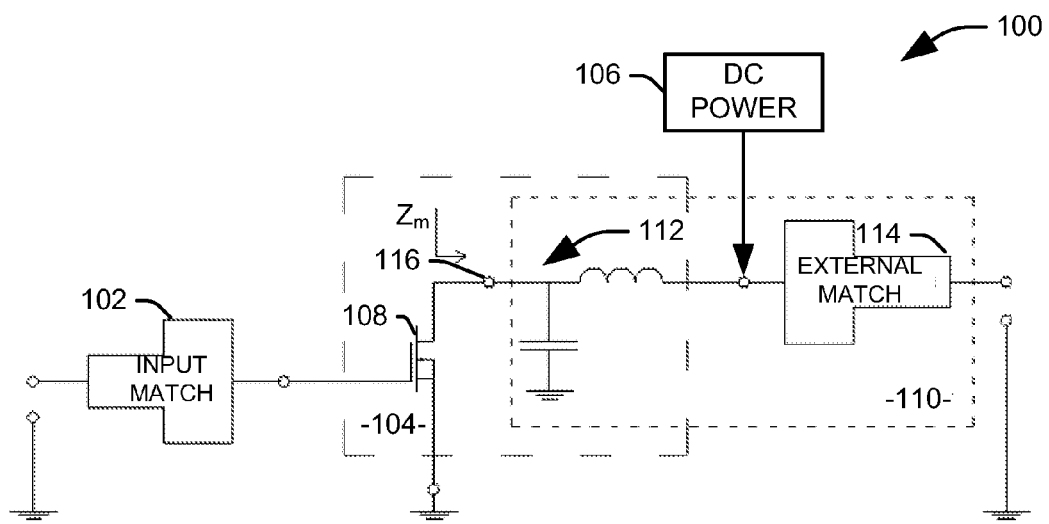
FIG. 4 illustrates one example of an amplifier that can be used in a system in accordance with an aspect of the present invention.

FIG. 4 illustrates one example of an amplifier 100 that can be used as output stage in a system in accordance with an aspect of the present invention. The amplifier 100 includes an input impedance matching component network 102, an active device 104, a direct current (DC) power supply and bias circuit 106, and an output impedance matching network 110. While the amplifier 100 is shown with one active device 104, it will be appreciated that an amplifier in accordance with an aspect of the present invention can include multiple active devices operating in parallel. In the illustrated implementation, the active device 104 is implemented with a MOSFET

108. The input DC bias network is not shown, however one skilled in the art will appreciate a necessity and associated components content.

The impedance matching network 110 includes internal matching circuitry 112 and an external impedance matching network 114. The impedance matching network 110, taken as a whole, can be characterized by scattered parameters matrix, denoted as $$\begin{pmatrix} S_{11} & S_{12} \\ S_{21} & S_{22} \end{pmatrix}.$$

It will be appreciated that, throughout this document, impedance reference is made to the output of the active device of a given amplifier. This is intended to refer to a point 116.

Returning to FIG. 3, each signal path is provided with an intermediate signal for amplification through respective driver amplifiers 80-82. A first driver amplifier 80 provides an amplified representation of the first intermediate signal to the output stage amplifier 72 associated with the first signal path. The signal is amplified at the output stage amplifier 72 to provide a first amplified signal.

A second driver amplifier 81 provides a conditioned representation of the second intermediate signal to a first signal splitting assembly 84, implemented in this example as a first three-decibel, ninety-degree signal splitter, that distributes the second intermediate signal equally between the two identical output stage amplifiers 73 and 74. It will be appreciated that the second intermediate signal is formed by applying a second transform function to the input baseband signal and using the result to modulate the RF carrier signal. The transform function can contain a zero level response, such that the amplifiers 73 and 74 are mute when a baseband input signal is below a first value. For example, the first value can be a first break point, representing a baseband input signal amplitude one-ninth of an amplitude dynamic range of the baseband input signal. Each of the output stage amplifiers 73 and 74 provide a second amplified signal to one of the through and coupled ports of a first three-decibel, ninety-degree hybrid combiner 86. The first amplified signal, from the first signal path, is delivered to an isolation port of the first hybrid combiner 86.

A third driver amplifier 82 delivers an amplified replica of the third intermediate signal to a second signal splitting assembly 88, implemented here as a three-decibel, ninety-degree signal splitter, that distributes the third intermediate signal equally between two identical output stage amplifiers 75-76 comprising a third output amplifier stage. It will be appreciated that the transform function for the third intermediate signal can contain zero level response, such that the amplifiers 75-76 are mute when a baseband input signal is below a second value, greater than the first value. For example, the second value can be a second break point, representing a baseband input signal amplitude two-ninths of the amplitude dynamic range of the baseband input signal. Each of the two amplifiers 75-76 comprising the third output amplifier stage delivers a third amplified signal to a combiner assembly 90. In the illustrated implementation, the hybrid combiner assembly 90 comprises a second three-decibel, ninety-degree hybrid combiner 90. The output of the first hybrid combiner 86, which is associated with the second signal path, is connected to an isolation port of the hybrid combiner 90.

FIGS. 5-8 are charts 160, 170, 180, and 190 illustrating dynamic characteristics of the system depicted in FIGS. 2 and 3. The horizontal axis of each chart represents a voltage of the input signal, and the charts are aligned such that horizontal axes are scaled equally and corresponding values on the horizontal axes 162, 172, 182, and 192 coincide. It will be appreciated that all of the values are normalized to a nominal impedance of one ohm and all input and output voltages are normalized by the saturation voltage of an individual amplifier from the five amplifiers comprising the amplifier stages. Accordingly, each of a plurality of vertical lines, referred to in the discussion of each chart as first through ninth break points, common to the four charts represents a unit of one normalized volt. Accordingly, the distance between any two break points represents one-ninth of the amplitude dynamic range of the baseband input signal. One of skill in the art, from this simplified example, will understand the operation of the system described herein.

Figure 5:
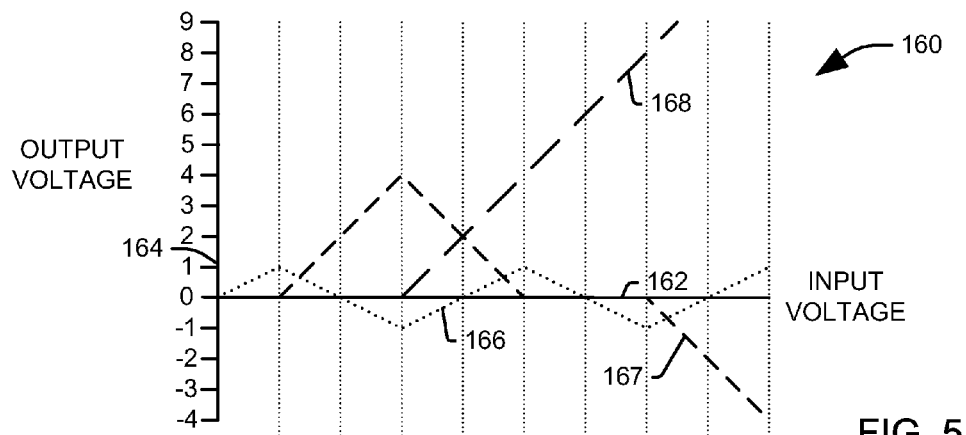
FIGS. 5-8 are charts illustrating the technical characteristics of one implementation of the system of FIGS. 2-4.
Figure 6:
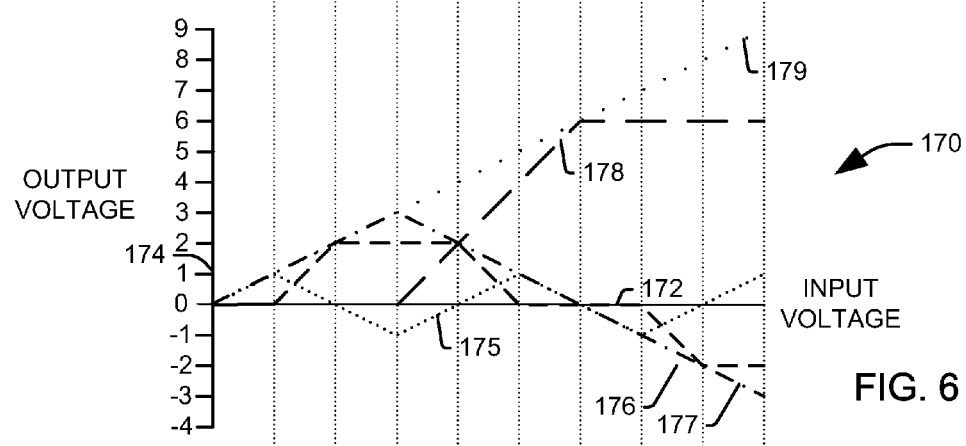

FIGS. 5 and 6, illustrate one example of the function of the implementation of the illustrative amplifier system of FIGS. 2 and 3. The vertical axes 164 and 174 of FIGS. 5 and 6 each represent an output voltage, in normalized units. In FIG. 5, an output of the first signal transformer 54 is represented by a dotted line 166, an output of the second transformer is represented by a dashed line 167, and the output of third transformer is represented by a second dashed line 168.

In FIG. 6, an output of the first signal path is represented by a dotted line 175, an output of the second signal path is represented by a dashed line 176, a composite of the first and second amplifier outputs, produced at the output of first hybrid combiner 86, is represented by a line 177 comprising alternating dashes and dots, the output of third amplifier stage is represented by a second dashed line 178, and the system output is represented by a second dotted line 179. It will be appreciated that the output at each amplifier stage is a function of the intermediate signal provided by its corresponding signal transformer and phase shifter and, other than some residual AM-AM and AM-PM distortion associated with the signal path, is representative of the function of those components of the system of FIG. 2.

As can be seen in FIG. 5, the transform function for the first intermediate signal 166 is provided such that output of the first modulator path increases linearly with the input voltage until a first break point voltage, corresponding to a normalized input voltage of one, is reached. Within this input voltage region the only path that delivers RF signal is first path. The RF signal from the output of first amplifier is applied to the isolation port of the output hybrid combiner 84.

Following the properties of two-way ninety-degree hybrid, the signal propagates to the outputs of second path amplifiers 73 and 74 splitting equally between them. Each signal travels further to the output port of active devices (MOSFETs in this example). The devices are biased in Class B/C and, therefore, have a high output reflection coefficient. Both amplifiers are identical and therefore have identical reflection coefficients. Both signals reflect back and arrive at the corresponding input ports of the output hybrid combiner phase shifted by ninety degrees. Given properties of three decibel, ninety-degree hybrid combiner, both signals travel to the output port of the hybrid combiner 90 and recombine there. Given high directivity of the combiner, no reflection signal is returned to the output of the first amplifier 72. Therefore, the impedance at the output of the first amplifier 72 is $Z_0$. This impedance will remain the same at this port over entire input signal dynamic range.

An amplitude response of the first path level scaler 72 inside the RF modulator is adjusted to drive the first amplifier 72 close to voltage saturation mode at the first break point. At this point, the efficiency of the first amplification path reaches its maximum value. Past the first break point, the transform response on the first signal path decreases linearly and becomes zero at a second break point voltage, corresponding to a normalized input voltage of two.

Between the first and second break points, the second transform function response 167 becomes a non-zero and grows linearly until reaching its maximum at a third break point at a normalized voltage of three volts. The second RF level scaler 73 is configured to provide an appropriate RF power level to drive the second path output stage amplifiers to voltage saturation mode by the second break point. The second signal path output stage remains in saturation as long as second transform response exceeds the normalized voltage of two volts. At the second break point, the only active amplifier is the second amplifier. No signal from the first signal path is present. Therefore, the impedance, $Z_{2\_0}$, presented at the output of each active device inside second path amplifier output stage can be expressed as:

$$z_{2\_0} = z_0 \frac{1+S_{11}}{1-S_{11}} \qquad \text{Eq. 1}$$

The output stage amplifiers in the second signal path are sized and matched to deliver output power level of twice the maximum peak power level delivered by the first signal path with load impedance=$Z_0$. The phase, of the RF signal generated by the first signal path can be adjusted by the phase shifter 66 such that the signal arrives at the output port of each active device inside the second path output stage amplifiers in phase with the signal generated by second path output stage. Given the previously mentioned peak power relationship, the active devices at the output stage of second path amplifier remain in voltage saturation mode continuously during the input voltage sweep from the second break point to the third break point. The load impedance at the output of active devices inside second amplifier's output stage, $Z_{2\_sat}$, can be expressed as:

$$z_{2\_sat} = \frac{Z_{2\_0}}{1 - \sqrt{2} \cdot \frac{V_1}{V_{2\_sat}}} \qquad \text{Eq. 2}$$

where $V_1$ is voltage at the output of first amplifier, and $V_{2\_sat}$ is voltage at the output of second amplifier in voltage saturation mode.

Past the second break point voltage, the first channel transform function response changes sign to negative, indicating a change in the signal phase such that the effect of the impedance modulation at the second amplifier path's output stage is reversed (i.e., a decrease in load impedance is provided). In general, the phase will be changed one hundred eighty degrees, although it will be appreciated that the actual phase change depends on output impedance of the active device and maybe different from one hundred eighty degrees. In addition, the phase change to produce this result can vary, particularly with the operational frequency of the system. To achieve best performance, the actual phase change can be determined experimentally for each operating frequency. The phase change shown on FIG. 5 and FIG. 6 is one hundred eighty degrees and describes a theoretical case of having active device with very high output impedance.

The amplitude of transformed signal provided on the first signal path grows linearly until reaching a third break point, achieving the same signal level as was achieved at the first break point, such that the output stage of the first signal path is driven to voltage saturation mode. Simultaneously, the response from the second signal transformer 55 continues growing linearly. This would drive output stage of the second signal path into even deeper voltage saturation mode if the RF signal supplied by first signal path did not change the load impedance at the output of each of amplifiers in the second signal path. As alluded to above, changing the phase of signal provided to the output stage of the first signal path causes a load impedance reduction at the output ports of active devices inside of the output stage of the second signal path. As a result, while the second amplifier stage remains at saturation, $Z_{2\_0}$, presented to the active devices inside output stage of the second signal path is reduced, such that:

$$z_{2\_sat} = \frac{z_{2\_0}}{2} \qquad \text{Eq. 3}$$

Reduction of the load impedance to half its nominal value will raise output power by a factor of two, since the input transform function provides a proportionally increasing drive on the input. This condition provides high efficiency operation for the second amplifier output stage across this amplitude region.

The RF signal supplied by the first signal path is significantly shifted in phase during reflection from the output ports of active devices inside the second path output stage amplifiers. This happens due to the fact that, being in voltage saturation mode, the output impedance of active devices is very low, and active devices become virtually a voltage source. As a result, the RF signal supplied by first amplifier vectorially adds with RF signal generated by the second path amplifiers, such that the output voltage of the system is increased proportionally. It will thus be appreciated that the first signal path and the second signal path, operating together, can provide an output composite signal, in which the amplitude changes in direct proportion to the input baseband signal amplitude for input voltage values below the third break point.

The output of the first signal transformer 54 continues to transition linearly between zero and 1V and back, alternating phase between the first phase, in which the output of the first signal path increases the load impedance at the output stage of the second signal path, to the second phase, in which the output of the first signal path decreases the load impedance at the output stage of the second signal path. The compound signal at the output of first hybrid combiner 86 is formed by the interaction between the signals generated by first signal path 166 and the second signal path 167 in reverse order.

Between the third and fourth break points, the signal provided by the first amplifier linearly changes from −1V to zero. The signal provided by second amplifier remains at the same voltage of 2V. The compound signal is linearly changing from 3V to 2V. During next amplitude interval the first transform function is causing the signal at the output of first amplifier to linearly change from zero to 1V. At the same time the second transform function causes the output of the second amplifier to change from 2V to zero. As a result, the signal at the output of first combiner 86 is changing from 2V to 1V. During the next amplitude interval the second amplifier output remains at zero and first amplifier output signal voltage linearly changes from 1V to zero. So, at break point six the voltage at the output of first combiner 86 becomes zero. During next three amplitude intervals the transfer function of the second amplifier goes negative indicating that the signal at the output of the second amplifier has a phase shift such that the effect of the impedance modulation at the third signal path's output stage is reversed. The compound output signal at the first combiner output is also phase shifted. Its amplitude grows linearly from zero at the sixth break point to −3V at the ninth break point.

The third signal transform 168 provides a zero voltage response until the third break point, where it increases linearly to the max value of $V_{in}$. At the third break point, a maximum value of the composite signal is reached. At this point, the third signal path becomes active. The third signal transformer 56, taken in combination with the third RF level scaler 69, drives the output stage of third amplifier into voltage saturation mode at a sixth break point, corresponding to a normalized input voltage of six volts. Between the third break point and the fourth break point, the output signal from the third amplifier output stage increases linearly. The compound signal produced by the first and second signal paths is delivered to an isolation input of the second hybrid combiner 90 and interacts with the RF signal generated by output stage of the third signal path in much the same manner as outputs of the first two signal paths interact at the first hybrid combiner 86, as considered earlier. To preserve the same proportion of signals during the interaction, the voltage of RF signal generated by third signal path driven into a voltage saturation should be twice the maximum level of the compound signal level delivered by the first two signal paths. Since, in the example of FIGS. 5-7, the maximum compound voltage delivered to the isolation input of the hybrid combiner 90 is three volts, the output stage of the third signal path should be sized and matched to deliver a maximum output RF signal voltage of six volts.

Immediately following the third break point, the compound signal generated by first and second signal paths is linearly reduced from three volts to two volts at the fourth break point. The phase shifter 66 inside the third signal path is adjusted such that the RF signals interact in-phase at the output port of active devices that form the output stage of the third signal path. With properly selected signal amplitudes, the level of the combined signal voltage at the output ports of active devices inside of output stage of the third signal path remains constant and is close to the power supply voltage. This provides a condition for third output stage to operate close to voltage saturation mode during this amplitude interval.

Between the fourth and sixth break points, the first transform function brings the corresponding output voltage of the first signal path to a positive maximum of 1V, while the output voltage of the second signal path is reduced to zero. The output voltage of the third signal path continues to rise linearly. At the fifth break point, the output of the system is five volts.

During the remaining amplitude intervals, the pattern of the first transform function repeats and can be described as a series of linear function segments with a duration of each section of two amplitude intervals. Each following section is a mirror reflection of the previous one (see FIG. 5). The second transform function 55 response between the fifth and seventh break points remains constant at zero volts. The third transform function 56 response keeps growing linearly and reaches 6V at the sixth break point. At this break point, the third amplifier's output stage gets into a voltage saturation mode. At this point, the load impedance at the output port of each output amplifier stage within third signal path is $Z_0$.

After the sixth break point, the RF signal provided by the first signal path switches phase and, after propagating to the output ports of active devices inside of the output stage of third amplifier, starts reducing the load impedance at the port. It also flips phase during reflection from the output port and becomes phase aligned with the RF signal generated by the output stage of the third signal path. As a result, the output compound signal amplitude grows as the output of the first signal path increases, to a value of seven volts.

Once the output of the first signal path peaks at the seventh break point, it begins declining toward zero. At the same time, the transform function 55 in the second signal path drives the output stage to deliver an RF signal increasing in amplitude from zero to two volts to the isolation port of hybrid combiner 90. This signal propagates to the output of the third amplifier and interacts with the third signal, causing reduction of load line impedance at the output ports of active devices inside of output stage of the third signal path. As the output stage of the second signal path hits saturation, the first signal path is mute, and the combined signal at the system's output has a voltage of eight volts.

At the ninth break point, with both the second and third signal paths driving their respective output stages in saturation, the transform function of the first signal path is increased linearly from zero volts to one volt at a phase appropriate for reducing the second signal path impedance and increasing its output level. Accordingly, the compound response of first and second amplifiers delivers a three volt RF signal to the isolation port of output hybrid combiner 90 when the output stage of the first signal path reaches saturation. The signal causes the load impedance for active devices inside the output stage of the third signal path to get reduced to half of the nominal load impedance value. This enables the third amplifier to generate twice the power level while the third amplifier output stage remains in saturation, and the composite output signal of the first and second signal paths is provided as to modulate the load impedance of the third amplifier stage.

Figure 7:
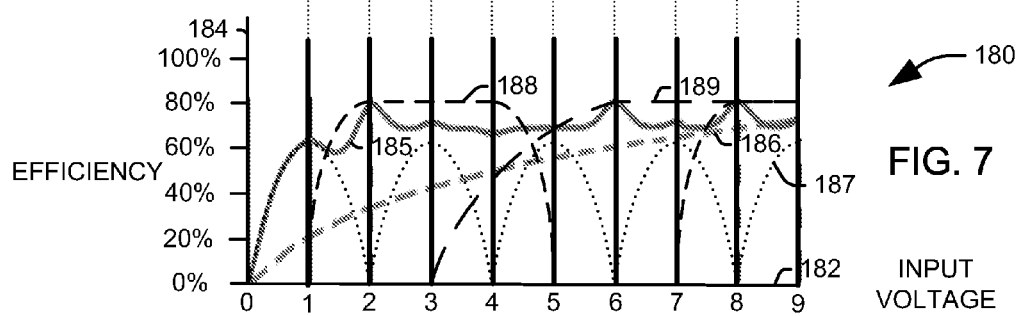

FIG. 7 is a chart 180 illustrating the efficiency, represented by the vertical axis 184, of the amplifier system of FIGS. 2 and 3 over the range of baseband input values. The system efficiency is represented by a solid gray line 185, and the typical efficiency of a standard class B amplifier operating over the entire voltage range is represented as a dashed gray line 186. The efficiency of the first amplifier assembly is represented by a dotted line 187, the efficiency of the second amplifier assembly is represented by a first black dashed line 188, and the efficiency of the third amplifier assembly is represented by a second black dashed line 189.

Taken alone, the efficiency 187 of the first amplifier assembly is periodic as the amplifier is ramped linearly back and forth between zero and saturation voltages. The efficiency 188 of the second amplifier assembly shows a similar pattern, with periods of maximum efficiency corresponding to its saturated operation regions between two volts and four volts, and between eight and nine volts. The efficiency 189 of the third amplifier assembly increases as the third amplifier ramps up to its saturation voltage between three volts and six volts, and remains at a maximum value as it operates in saturation above six volts.

The system provides a number of advantages. RF communication signals created with digital modulation techniques can be characterized by a Peak-to-Average Power Ratio (PAPR). The high definition television broadcast industry employs such modulation standards, for example, in the Very High Frequency (VHF) and Ultra High Frequency (UHF) bands. One example would be the Digital Video Broadcasting-Terrestrial (DVB-T) modulation used in many countries around the world. A single TV channel can include many spectral carriers (e.g., thousands) tightly spaced over an 8 MHz frequency range. This creates a signal with amplitude modulation envelope varying from zero to a peak level of 6 db to 12 dB above average signal power level depending on modulation standard. After being amplified by a conventional class AB biased amplifier intermodulation distortions are being generated. To maintain in-band and out-of-band intermodulation distortions (IMD) under the industry specified limit, the amplifier should have a capability to amplify signal peaks. Currently used Class AB RF amplifiers operate at average power levels backed off from their peak power capability by the factor of PAPR. This leads to a relatively low DC-RF efficiency. By using our dynamic load impedance modulation technique the DC-RF efficiency can be increased significantly. A power capability of the first signal path output stage can be scaled to modulate load impedance of second signal path output stage over desired amplitude range. As a result of this the second signal path output stage would operate at voltage saturation mode over part of output power range, contributing to the overall system efficiency.

In addition, this method is not frequency sensitive. By adjusting the phase shift of the RF signal that propagates through the first signal path, the required phase relationships between first and second paths can be achieved. The same way, by adjusting a phase shift in the third signal path, the required phase relationships between the third path signal and the other signals can be achieved. Therefore, a wide range of carrier frequencies can be used. Most countries have their frequency range allocated for television (TV) channels that spans from 470 MHz to 862 MHz at UHF and from 175 MHz to 252 MHz at VHF. The TV allocated frequency span at UHF is 59% wide and at VHF is 36% wide. In accordance with an aspect of the present invention, a high efficiency amplifier can operate at a frequency range as wide as the bandwidth of a 3-dB directional coupler, which can cover either of these ranges or even more by adding sections to the input and output 3-dB ninety-degree hybrid combiners, allowing for a transmitter to operate across a given allotted frequency span without any hardware adjustment.

Figure 8:
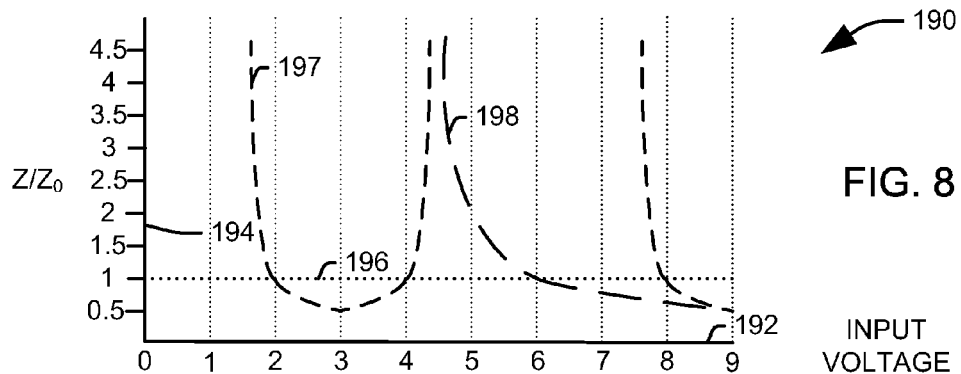

FIG. 8 is a chart 190 illustrating the normalized load impedance ($Z/Z_0$ experienced at the active devices within each amplifier assembly, represented by the vertical axis 194, of the amplifier system of FIGS. 2 and 3 over the range of baseband input voltage values. The load impedance at the first amplifier assembly is represented by a dotted line 196, the load impedance at the second amplifier assembly is represented by a first dashed line 197, and the efficiency of the third amplifier assembly is represented by a second dashed line 198.

Since the output stage of first amplifier assembly is not subject to modulation of the load impedance, its load impedance ratio 196 remains constant at one. The load impedance at the second amplifier assembly 197 is considerably greater than one at points in which the first amplifier assembly is operated in phase with it, approaching one as the output of the first amplifier assembly decreases to zero at the input voltage value of two volts. The load impedance ratio 197 then decreases to a minimum value of one-half at three volts as the first amplifier assembly is operated out of phase with the second amplifier assembly, and increases again as the output of the first amplifier assembly returns to zero at the input voltage value of four volts. The load impedance attributed to the third amplifier assembly 198 is likewise considerably greater than one at points in which the composite signal of the first amplifier assembly and the second amplifier assembly is in phase with the third amplifier assembly output signal. The impedance ratio approaches one as the composite decreases to zero just as the third amplifier assembly reaches saturation at six volts. The load impedance ratio 198 then decreases to a minimum value of one-half at a maximum baseband signal as the composite signal is provided out of phase with the signal generated at the output ports of active devices inside the third amplifier assembly.

Figure 9:
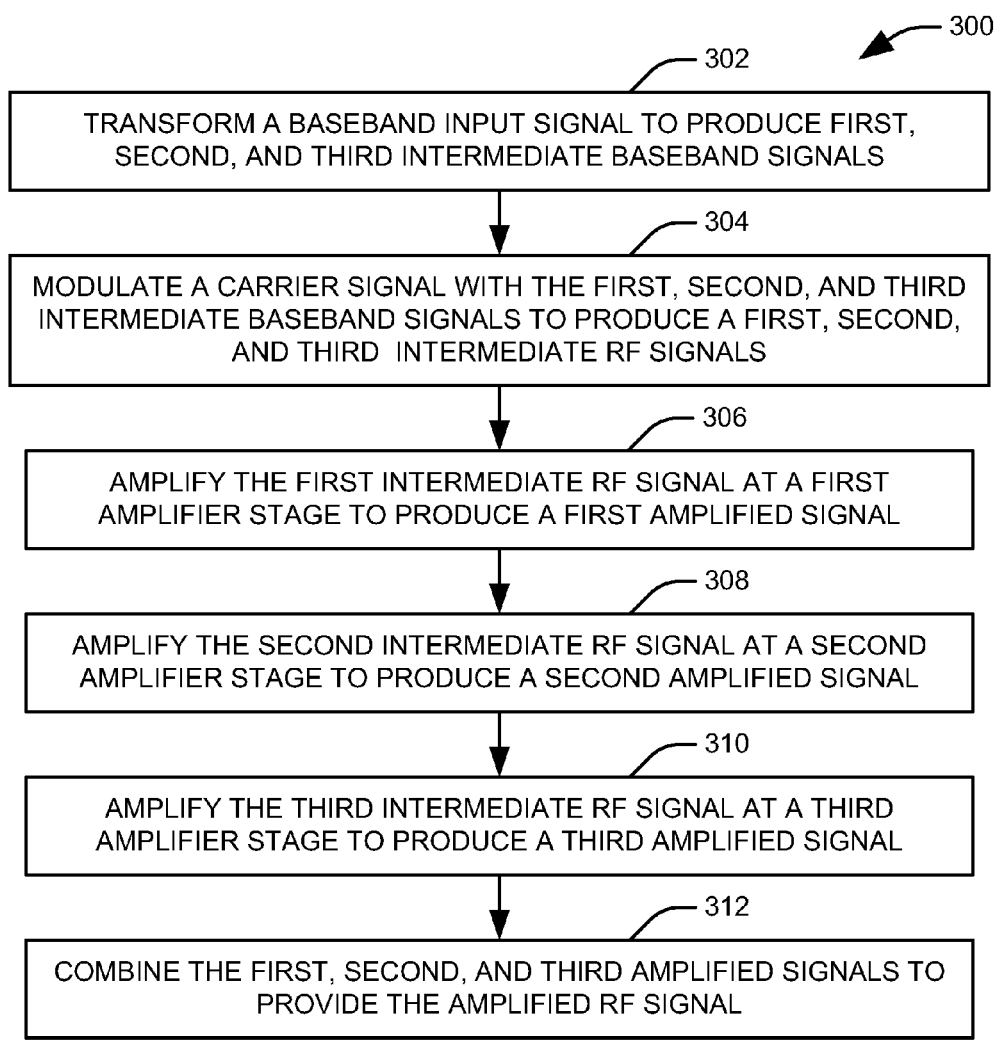
FIG. 9 illustrates one example of a method for providing an amplified radio frequency (RF) signal from a baseband input signal.

FIG. 9 illustrates one example of a method 300 for providing an amplified radio frequency (RF) signal from a baseband input signal. At 302, the baseband input signal is transformed to produce first, second, and third intermediate baseband signals. In accordance with an aspect of the present invention, the first and second intermediate baseband signals are produced such that, once modulated and amplified by their associated signal paths, the first amplified signal has an amplitude that increases and decreases linearly and periodically between maximum and minimum values over dynamic range of input baseband signal, and the second amplified signal has an amplitude that is zero when the baseband input signal is below a first value. The value can be a first break point, representing a baseband input signal amplitude one-ninth of an amplitude dynamic range of the baseband input signal.

In one implementation, the second amplified signal grows linearly after the first break point and achieves a saturated value at a second break point, representing a baseband input signal amplitude two-ninths of the amplitude dynamic range of the baseband input signal. It remains flat after that until a fourth break point, representing a baseband input signal amplitude four-ninths of an amplitude dynamic range of the baseband input signal. Then it linearly decreases following the shape of transform function and at a fifth break point, representing a baseband input signal amplitude fifth-ninths of the amplitude dynamic range of the baseband input signal, it reaches zero level. It remains at zero level until a seventh break point representing a baseband input signal amplitude seven-ninths of the amplitude dynamic range of the baseband input signal, at which point it changes phase one hundred eighty degrees and grows linearly in a negative direction. It reaches saturation at an eighth break point, representing a baseband input signal amplitude eight-ninths of the amplitude dynamic range of the baseband input signal and remains flat till a ninth break point representing a maximum baseband input amplitude.

Similarly, the third intermediate baseband signal is produced such that, once transformed and amplified, the third amplified signal has an amplitude that is zero when the baseband input signal is below the third break point. The third intermediate baseband signal grows linearly between the third break point and a sixth break point, representing a baseband input signal amplitude two-thirds of the amplitude dynamic range of the baseband input signal. The third intermediate baseband signal then becomes flat due to voltage saturation at that point to the peak of the input dynamic range.

At 304, a carrier signal is modulated with each of the first, second, and third intermediate baseband signals to provide respective first, second, and third intermediate RF signals. At 306, the first intermediate RF signal is amplified to produce the first amplified signal. At 308, the second intermediate RF signal is amplified to produce the second amplified signal. At 310, the third intermediate RF signal is amplified to produce the third amplified signal.

At 312, the first amplified signal, the second amplified signal, and the third amplified signal are combined to provide the amplified output RF signal. For example, the signals can be combined with a series of three dB quadrature hybrid combiners. In one implementation, the signals are combined such that the first amplified signal modulates a load impedance at respective outputs of at least one of a plurality of active devices associated with the second amplifier stage. Alternatively or additionally, the signals can be combined such that a load impedance at an output of active devices within an output stage of an signal path associated with the third amplified signal is modulated by one or both of the first amplified signal and the second amplified signal.

In accordance with an aspect of the present invention, the modulation of the load impedance of a given amplifier can be controlled via the phase difference between interacting amplified signals at the output ports of one or more active devices associated with the amplifier stage. In one example, the first transformed baseband signal such that the first amplified signal is one hundred eighty degrees out-of-phase with the third amplified signal at the output ports of active devices in the third amplifier output stage when the baseband input signal is between the sixth break point input value and a ninth break point input value and in-phase with the third amplified signal when the baseband input signal is between third and sixth break point input value.

Similarly, the second transformed baseband signal can be produced such that the second amplified signal is applied out-of-phase with the third amplified signal at the output ports of active devices associated with the third signal path output stage when the baseband input signal is above the seventh break point input value.

From the above description of the invention, those skilled in the art will perceive improvements, changes, and modifications. Such improvements, changes, and, modifications within the skill of the art are intended to be covered by the appended claims.

Having described the invention we claim:

1. A system for providing a compound amplified radio frequency (RF) signal representing a baseband input signal, the system comprising:
   a first signal path, configured to amplify a first intermediate signal to provide a first amplified signal;
   a second signal path comprising a plurality of amplifiers configured to amplify a second intermediate signal to provide a second amplified signal;
   a third signal path, comprising a plurality of amplifiers, configured to amplify the third intermediate signal to provide a third amplified signal; and
   a signal combiner assembly configured to combine the first amplified signal, the second amplified signal, and the third amplified signal to produce the compound amplified RF signal, such that the first amplified signal modulates a load impedance at respective outputs of at least one of a plurality of active devices associated with the plurality of amplifiers in the second signal path and one of the first amplified signal, the second amplified signal, and a sum of the first amplified signal and the second amplified signal modulates a load impedance of at least one of a plurality of active devices associated with the plurality of amplifiers in the third signal path.

2. The system of claim 1, further comprising an RF modulator configured to modulate an RF carrier signal with a baseband input signal to provide the first intermediate signal, the second intermediate signal, and the third intermediate signal such that the one of the first amplified signal, the second amplified signal, and the sum of the first amplified signal and the second amplified signal is out-of-phase with the third amplified signal at the output of at least one of the plurality of active devices in the third signal path when an amplitude of the baseband input signal is in a first amplitude range and the one of the first amplified signal, the second amplified signal, and the sum of the first amplified signal and the second amplified signal is in phase with the third amplified signal at the output of the at least one active device within the third signal path when the amplitude of the baseband input signal is in a second amplitude range.

3. The system of claim 2, the RF modulator being configured to modulate the RF carrier signal such that the third signal path is mute and the first amplified signal is in-phase with the second amplified signal at the output of at least one of the plurality of active devices in the second signal path when the amplitude of the baseband input signal is in a third range, and the third amplifier signal path is mute and the first amplified signal is out-of-phase with the second amplified signal at the output of the at least one of the plurality of active devices in the second signal path when the amplitude of the baseband input signal is in a fourth amplitude range.

4. The system of claim 2, the RF modulator being configured to modulate the RF carrier signal such that each of the first amplitude range and the second amplitude range comprises respective first and second amplitude subranges, the first amplified signal being in-phase with the second amplified signal at the output of the at least one of the plurality of active devices in the second signal path when the amplitude of the baseband input signal is in one of the first amplitude subranges and the first amplified signal being out-of-phase with the second amplified signal at the output of the at least one of the plurality of active devices in the second signal path when the amplitude of the baseband input signal is in one of the second amplitude subranges.

5. The system of claim 2, the RF modulator comprising first, second, and
   third phase shifters, associated with the first, second, and third signal paths, each configured to provide a continuous phase shift to its respective intermediate signal to account for different phase shift values required at different RF carrier frequencies as to maintain desired phase relations among the signals provided by the various signal paths.

6. The system of claim 2, the RF modulator comprising first, second, and third signal transformers, each associated with a corresponding one of the first, second, and third signal paths, that provide adaptive predistortion along their associated signal path, the first signal transformer receiving a sampled output of the first signal path through a first downconverter, the second signal transformer receiving a sampled output signal of the sum of the first amplified signal and the second amplified signal through a second downconverter, and the third signal transformer receives a sampled system output through a third downconverter.

7. The system of claim 1, the signal combiner assembly comprising a plurality of hybrid combiners, an output port of a first hybrid combiner being connected to an isolation port of a second hybrid combiner.

8. The system of claim 7, each of the first hybrid combiner and the second hybrid combiner comprising three-decibel ninety-degree hybrid combiners.

9. The system of claim 7, wherein the outputs of the plurality of amplifiers in the second signal path are connected to the through and coupled ports of the first hybrid combiner and the outputs of the plurality of amplifiers in the third signal path are connected to the through and coupled ports of the second hybrid combiner.

10. The system of claim 1, an amplifier associated with the first signal path being biased in class AB, the plurality of amplifiers associated with the second signal path being biased in one of class B and class C, and the plurality of amplifiers associated with the third signal path being biased in one of class B and class C.

11. The system of claim 1, further comprising a first signal splitting assembly that distributes the second intermediate signal to the plurality of amplifiers associated with the second signal path, and a second signal splitting assembly that distributes the third intermediate signal to the plurality of amplifiers associated with the third signal path, each of the first signal splitting assembly and the second signal splitting assembly comprising at least one three-decibel, ninety-degree quadrature signal splitter.

12. The system of claim 1, further comprising first, second, and third level scalers associated, respectively, with the first, second, and third signal paths, each configured to scale the intermediate signal provided to each amplifier assembly as to drive its constituent amplifiers into saturation for an appropriate range of the baseband input signal.

13. A system for providing an amplified radio frequency (RF) signal representing a baseband input signal, the system comprising:
    a first amplifier assembly, on a first signal path, configured to amplify a first intermediate signal to provide a first amplified signal;
    a second amplifier assembly on a second signal path comprising a plurality of amplifiers configured to amplify a second intermediate signal to provide a second amplified signal;
    a third amplifier assembly on a third signal path, comprising a plurality of amplifiers, configured to amplify the third intermediate signal to provide a third amplified signal; and
    an RF modulator configured to modulate an RF carrier signal with the baseband input signal to provide the first intermediate signal, the second intermediate signal, and the third intermediate signal such that one of the first amplified signal, the second amplified signal, and the combination of the first amplified signal and the second amplified signal is out-of-phase with the third amplified signal at the output of at least one of a plurality of active devices in the third amplifier assembly when an amplitude of the baseband input signal is in a first amplitude range and one of the first amplified signal, the second amplified signal, and the combination of the first amplified signal is in phase with the third amplified signal at the output of the at least one active device within the third amplifier assembly when the amplitude of the baseband input signal is in a second amplitude range.

14. The system of claim 13, further comprising a signal combiner assembly configured to combine the first amplified signal, the second amplified signal, and the third amplified signal to produce the amplified RF signal, such that the first amplified signal modulates a load impedance at respective outputs of at least one of a plurality of active devices associated with the plurality of amplifiers in the second amplifier assembly and one of the first amplified signal, the second amplified signal, and a combination of the first amplified signal and the second amplified signal modulates a load impedance at respective outputs of the at least one of the plurality of active devices associated with the plurality of amplifiers in the third amplifier assembly.

15. The system of claim 13, the RF modulator further being configured to modulate the RF carrier signal such that the first amplified signal has an amplitude that increases and decreases linearly and periodically between zero and a saturation amplitude associated with the first amplifier assembly as the baseband input signal increases.

16. The system of claim 13, further comprising a first signal splitting assembly that distributes the second intermediate signal to the plurality of amplifiers associated with the second amplifier assembly, and a second signal splitting assembly that distributes the third intermediate signal to the plurality of amplifiers associated with the third amplifier assembly, each of the first signal splitting assembly and the second signal splitting assembly comprising at least one three-decibel, ninety-degree quadrature signal splitter.

17. A method for providing an amplified radio frequency (RF) output signal from a baseband input signal, comprising:
    transforming the baseband input signal to produce first, second, and third transformed baseband signals;
    modulating a carrier signal with each of the first, second, and third transformed baseband signals to produce first, second, and third intermediate signals;
    amplifying the first, second, and third intermediate signals at respective first, second, and third amplifier assemblies to produce first, second, and third amplified signals; and
    combining the first, second, and third amplified signals to provide the amplified RF output signal;
    wherein transforming the baseband input signal comprises producing each of the first, second, and third transformed baseband signals such that the first amplified signal has an amplitude that increases and decreases linearly and periodically between maximum and minimum values of an amplitude dynamic range of the baseband input signal, the second amplified signal has an amplitude that is zero when the baseband input signal is below a first break point representing a baseband input signal amplitude one-ninth of the amplitude dynamic range of the baseband input signal and reaches a maximum value at a second break point, representing a baseband input signal amplitude two-ninths of the amplitude dynamic range of the baseband input signal and the third amplified signal has an amplitude that is zero when the baseband input signal is below a third break point representing a baseband input signal amplitude one-third of the amplitude dynamic range of the baseband input signal.

18. The method of claim 17, wherein combining the first, second, and third amplified signals comprises combining the first, second, and third amplified signals such that the first amplified signal modulates a load impedance at respective outputs of at least one of a plurality of active devices associated with the second amplifier assembly and one of the first amplified signal, the second amplified signal, and a combination of the first amplified signal and the second amplified signal modulates a load impedance at respective outputs of at least one of a plurality of active devices associated with the third amplifier assembly.

19. The method of claim 17, wherein transforming the baseband input signal comprises producing the first transformed baseband signal such that the first amplified signal is out-of-phase with the third amplified signal at respective outputs of at least one of a plurality of active devices associated with the third amplifier assembly when the baseband input signal is above a fourth break point, representing a baseband input signal amplitude two-thirds of an amplitude dynamic range of the baseband input signal, and in-phase with the third amplified signal at the outputs of the at least one of the plurality of active devices when the baseband input signal is between the third and fourth break points.

20. The method of claim 17, wherein distorting the baseband input signal comprises producing the second distorted baseband signal such that the second amplified signal is active for at least a portion of the dynamic range of the baseband input signal that exceeds a fourth break point and the second amplified signal is out-of-phase with the third amplified signal at respective outputs of at least one of a plurality of active devices associated with the third amplifier assembly when the baseband input signal is above the fourth break point and the second amplifier assembly is active.

21. The system of claim 17, wherein the second amplified signal has an amplitude that increases linearly within a first range of baseband input values beginning at the first break point, remains at a saturation amplitude associated with the second amplifier assembly for a second range of baseband input values contiguous with the first range, decreases linearly for a third range of baseband input values contiguous with the second range, and remains at zero for a fourth range of baseband input values contiguous with the third range.

* * * * *

UNITED STATES PATENT AND TRADEMARK OFFICE
CERTIFICATE OF CORRECTION

| | | |
|---|---|---|
| PATENT NO. | : 9,219,444 B2 | Page 1 of 1 |
| APPLICATION NO. | : 13/565119 | |
| DATED | : December 22, 2015 | |
| INVENTOR(S) | : Dmitri Borodulin et al. | |

It is certified that error appears in the above-identified patent and that said Letters Patent is hereby corrected as shown below:

Claims

Claim 3, column 16, line 9 reads, "and the third amplifier signal path is mute" should read --and the third signal path is mute--

Signed and Sealed this
Fifteenth Day of March, 2016

Michelle K. Lee
*Director of the United States Patent and Trademark Office*